(12) United States Patent
Lee et al.

(10) Patent No.: US 11,217,884 B2
(45) Date of Patent: Jan. 4, 2022

(54) RADIATION DEVICE

(71) Applicant: InnoLux Corporation, Miao-Li County (TW)

(72) Inventors: Hang-Lang Lee, Miao-Li County (TW); I-Yin Li, Miao-Li County (TW); Tang-Chin Hung, Miao-Li County (TW); Pei-Chi Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/904,646

(22) Filed: Jun. 18, 2020

(65) Prior Publication Data

US 2021/0021023 A1  Jan. 21, 2021

Related U.S. Application Data

(60) Provisional application No. 62/874,109, filed on Jul. 15, 2019.

(30) Foreign Application Priority Data

Apr. 30, 2020 (CN) .......................... 202010362576.8

(51) Int. Cl.
 *H01Q 1/38* (2006.01)
 *H03C 7/02* (2006.01)

(52) U.S. Cl.
 CPC ................. *H01Q 1/38* (2013.01); *H03C 7/02* (2013.01)

(58) Field of Classification Search
 None
 See application file for complete search history.

(56) References Cited

U.S. PATENT DOCUMENTS

| 2007/0285611 A1* | 12/2007 | Nose ................. G02F 1/133345 349/179 |
| 2012/0092577 A1* | 4/2012 | Shi ..................... G02F 1/13338 349/43 |
| 2019/0013571 A1* | 1/2019 | Hsu ......................... H01Q 1/36 |
| 2019/0194494 A1* | 6/2019 | Mizusaki ............... C09J 133/04 |

\* cited by examiner

*Primary Examiner* — Anh Q Tran
(74) *Attorney, Agent, or Firm* — McClure, Qualey & Rodack, LLP

(57) ABSTRACT

A radiation device includes: a first substrate; a second substrate; a dielectric layer disposed between the first substrate and the second substrate; and a film layer structure disposed on the first substrate. The resistivity of the film layer structure is between $10^8$ and $5 \times 10^{14}$ Ω-cm. Therefore, frequency modulation range of radiation signals of the radiation device can be increased.

20 Claims, 4 Drawing Sheets

RADIATION DEVICE

CROSS REFERENCE TO RELATED APPLICATIONS

This application claims the benefit of U.S. Provisional Application No. 62/874,109 filed Jul. 15, 2019, the entirety of which is incorporated by reference herein.

This application claims priority of China Patent Application No. 202010362576.8, filed on Apr. 30, 2020, the entirety of which is incorporated by reference herein.

BACKGROUND OF THE INVENTION

Field of the Invention

The present disclosure relates to a radiation device, and particularly to a radiation device that increases the frequency modulation range of radiation signals.

Description of the Related Art

Some electronic products, such as radiation devices, are equipped with communications capabilities, but the performance of these radiation devices still needs to be improved so that they can, for example, increase the frequency modulation range of radiation signals.

The purpose of the present disclosure is to provide a radiation device that increases the frequency modulation range of radiation signals.

BRIEF SUMMARY OF THE INVENTION

An embodiment of the present invention provides a radiation device including: a first substrate, a second substrate, a dielectric layer disposed between the first substrate and the second substrate, and a film layer structure disposed on the first substrate; wherein a resistivity of the film layer structure is between $10^8$ and $5 \times 10^{14}$ $\Omega$-cm.

Another embodiment of the present invention provides a radiation device including: a first substrate, a second substrate, a dielectric layer disposed between the first substrate and the second substrate, and a film layer structure disposed on the first substrate; wherein the dielectric constant of the film layer structure is between 3 and 5.

According to the radiation device of the present disclosure, it is possible to increase the frequency modulation range of the radiation signal and improve the efficiency of the radiation device.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
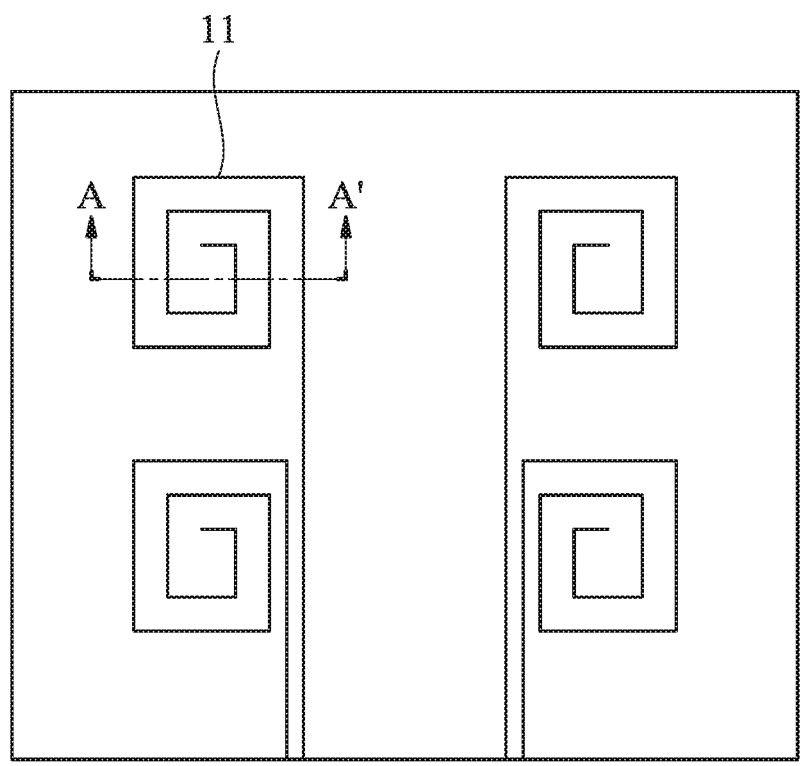
FIG. 1 is a top view of a radiation device according to an embodiment of the present disclosure.

The following description provides many different embodiments, or examples, for implementing different features of the disclosure. Elements and arrangements described in the specific examples below are merely used for the purpose of concisely describing the present disclosure and are merely examples, which are not intended to limit the present disclosure. For example, a description of a structure wherein a first feature is on or above a second feature may refer to cases where the first feature and the second feature are in direct contact with each other, or it may refer to cases where there is another feature disposed between the first feature and the second feature, such that the first feature and the second feature are not in direct contact.

The terms "first" and "second" of this specification are used only for the purpose of clear explanation and are not intended to limit the scope of the patent. In addition, terms such as "the first feature" and "the second feature" are not limited to the same or different features.

Spatial terms, such as upper or lower, are used herein merely to describe the relationship of one element or feature to another element or feature in the drawings. In addition to the directions provided in the drawings, there are devices that may be used or operated in different directions.

In the specification, the terms "about" and "approximately" usually mean within 10%, within 5%, within 3%, within 2%, within 1%, or within 0.5% of a given value or range. The quantity given here is an approximate quantity, and the meaning of "approximate" and "approximately" can still be implied without specifying "approximate" or "approximately". In addition, the term "range is between the first value and the second value" means that the range includes the first value, the second value, and other values between them.

In addition, the description "the first component is perpendicular to the second component" is not limited to an angle of 90 degrees between the first component and the second component. It also includes an acceptable tolerance range, such as angles of 85 to 95 degrees between the first component and the second component. The description "the first component is parallel to the second component" is not limited to an angle of 0 degree between the first component and the second component. It also includes an acceptable tolerance range, such as angles of −5 to 5 degrees between the first component and the second component.

The shapes, dimensions, and thicknesses in the drawings may not be scaled or be simplified for clarity of illustration, and are provided for illustrative purposes only. According to some embodiments of the present disclosure, the provided radiation device may be an antenna device, a liquid-crystal display device, a sensing device, a light emitting device, a splicing device, other suitable devices, or a combination of the above devices, but it is not limited thereto. The radiation device may be a bendable or flexible electronic device. The antenna device may be, for example, a liquid-crystal antenna, but it is not limited thereto. The splicing device may be, for example, an antenna splicing device, but it is not limited thereto. It should be understood that the electronic device may be any arrangement and combination described above, but the disclosure is not limited thereto.

Figure 2:
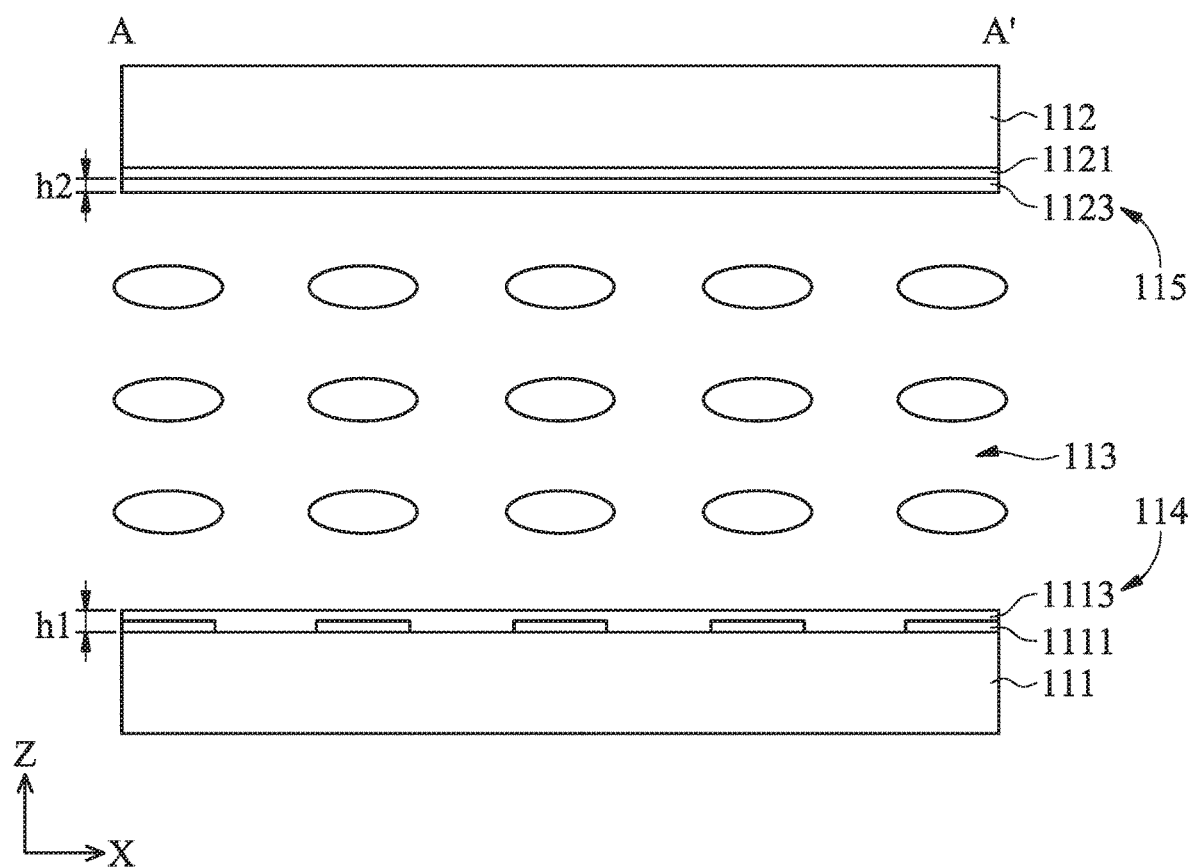
FIG. 2 is a cross-sectional view of a modulation unit of a radiation device according to an embodiment of the present disclosure.

Please refer to FIG. 1 and FIG. 2. FIG. 1 is a top view of the radiation device 1 according to an embodiment of the present disclosure. The radiation device 1 of the present disclosure can operate in a high-frequency range, for example, it can be a liquid-crystal antenna operating at a high frequency, but it is not limited thereto. For example, the high-frequency range may be between 1 gigahertz (GHz) and 80 gigahertz (GHz), but it is not limited thereto. The radiation device 1 may include a plurality of modulation units 11. The modulation units 11 form a modulation unit array, and each modulation unit 11 is controlled by an electrical signal to adjust the arrangement of the medium (for example, liquid-crystal molecules) in each modulation unit 11 to have different dielectric constants. Therefore, the phase of the radiation signal transmitted or received by each modulation unit 11 can be controlled, and then the direction of the radiation signal emitted by the modulation unit array (the direction in which the radiation is transmitted or received by the liquid-crystal antenna, for example) can be adjusted.

FIG. 2 is a cross-sectional view taken along line A-A' of the modulation unit 11 of the radiation device 1 according to an embodiment of the present disclosure. As shown in FIG. 2, the modulation unit 11 may include a first substrate 111, a second substrate 112, and a dielectric layer 113. The first substrate 111 and the second substrate 112 are disposed opposite each other, and the dielectric layer 113 is disposed between the first substrate 111 and the second substrate 112. In an embodiment, the first substrate 111 and the second substrate 112 may include rigid substrates or flexible substrates. The rigid substrate may include glass, quartz, ceramic, sapphire, or other suitable materials, or a combination of the foregoing materials. The flexible substrate may include polyimide (PI), polyethylene terephthalate (PET) or other suitable materials, or a combination of the foregoing materials. However, the materials of the first substrate 111 and the second substrate 112 are not limited thereto. The dielectric layer 113 may be, for example, liquid crystal, such as liquid crystal with electrically controlled birefringence, but is not limited thereto.

The modulation unit 11 may further include a first electrode 1111 and a second electrode 1121. The first electrode 1111 may be directly or indirectly disposed on the first substrate 111, and the second electrode 1121 may be directly or indirectly disposed on the second substrate 112. A film layer structure 114 is disposed on the first electrode 1111, and a film layer structure 115 is disposed on the second electrode 1121. When the dielectric layer 113 is liquid crystal, the film layer structure 114 may include a first alignment layer 1113, and the film layer structure 115 may include a second alignment layer 1123. The first alignment layer 1113 and the second alignment layer 1123 may include polyimide (PI), but is not limited thereto. The surfaces of the first alignment layer 1113 and the second alignment layer 1123 can be rubbed to form grooves, or applied with the optical alignment treatment, so that the alignment direction of the liquid crystals tends to be consistent. It can also provide the liquid crystal at a pre-tilted angle, so that the liquid crystal has a better driving effect. In the embodiment shown in FIG. 3, the film layer structure 114 may further include a first insulating layer 1112, and the first insulating layer 1112 is disposed between the first substrate 111 and the first alignment layer 1113. In the embodiment shown in FIG. 3, the film structure 115 may further include a second insulating layer 1122, and the second insulating layer 1122 is disposed between the second substrate 112 and the second alignment layer 1123. The first insulating layer 1112 and the second insulating layer 1122 may include silicon oxide (SiOx), silicon nitride (SiNy), silicon oxynitride (SiOxNy), or other suitable materials or combinations thereof, but is not limited thereto. The structures of the first substrate 111 and the second substrate 112 in FIGS. 2 and 3 can be combined with each other, and are not limited thereto.

The frequency modulation range of the radiation signal emitted by the radiation device 1 is affected by the modulation range of the equivalent capacitance in the modulation unit 11. Therefore, if the modulation range of the equivalent capacitance of the modulation unit 11 is increased, the frequency modulation range of the radiation signal emitted by the radiation device 1 can be improved, and the efficiency of the radiation device can be improved. For example, as shown in FIG. 2, the equivalent capacitance between the first electrode 1111 and the second electrode 1121 is the sum of the capacitance values of all the stacks between the two electrodes. These stacks include the film layer structure 114, the dielectric layer 113, and film layer structure 115. For example, when the dielectric layer 113 is liquid crystal, the equivalent capacitance between the first electrode 1111 and the second electrode 1121 is the sum of the capacitance values of the first alignment layer 1113, the dielectric layer 113, and the second alignment layer 1123, but it is not limited thereto.

An embodiment of the present disclosure is to adjust the resistivity of the film layer structure 114, the film layer structure 115, or both to increase the modulation range of the equivalent capacitance of the modulation unit 11. The voltage driving frequency of the radiation device 1 of the present disclosure, which is the driving frequency of the voltage applied to the dielectric layer 113 by the first electrode 1111 and the second electrode 1121, may be between 1 Hz and 1 kilohertz (kHz), but it is not limited thereto. The resistivity of the film layer structure 114, the film layer structure 115, or both may be adjusted to between $10^8$ and $5 \times 10^{14}$ ohm-cm ($\Omega \cdot Cm$), or it may be between $10^{12}$ and $10^{14}$ ohm-cm. By adjusting the resistivity of the film layer structure 114 or the film layer structure 115, the modulation range of the equivalent capacitance of the radiation device 1 can be improved. In one embodiment, the resistivity of the film layer structure 114 and the film layer structure 115 may be adjusted to be between $10^8$ and $5 \times 10^{14}$ ohm-cm, or it may be between $10^{12}$ and $10^{14}$ ohm-cm.

In the embodiment shown in FIG. 2, for example, when the first alignment layer 1113 is used as a film layer structure 114 and the second alignment layer 1123 is used as a film layer structure 115, the resistivity of the first alignment layer 1113 and/or the second alignment layer 1123 can be adjusted to between $10^8$ and $5 \times 10^{14}$ ohm-cm, or it can be between $10^{12}$ and $10^{14}$ ohm-cm, which can increase the modulation range of the equivalent capacitance of the radiation device 1.

Figure 3:
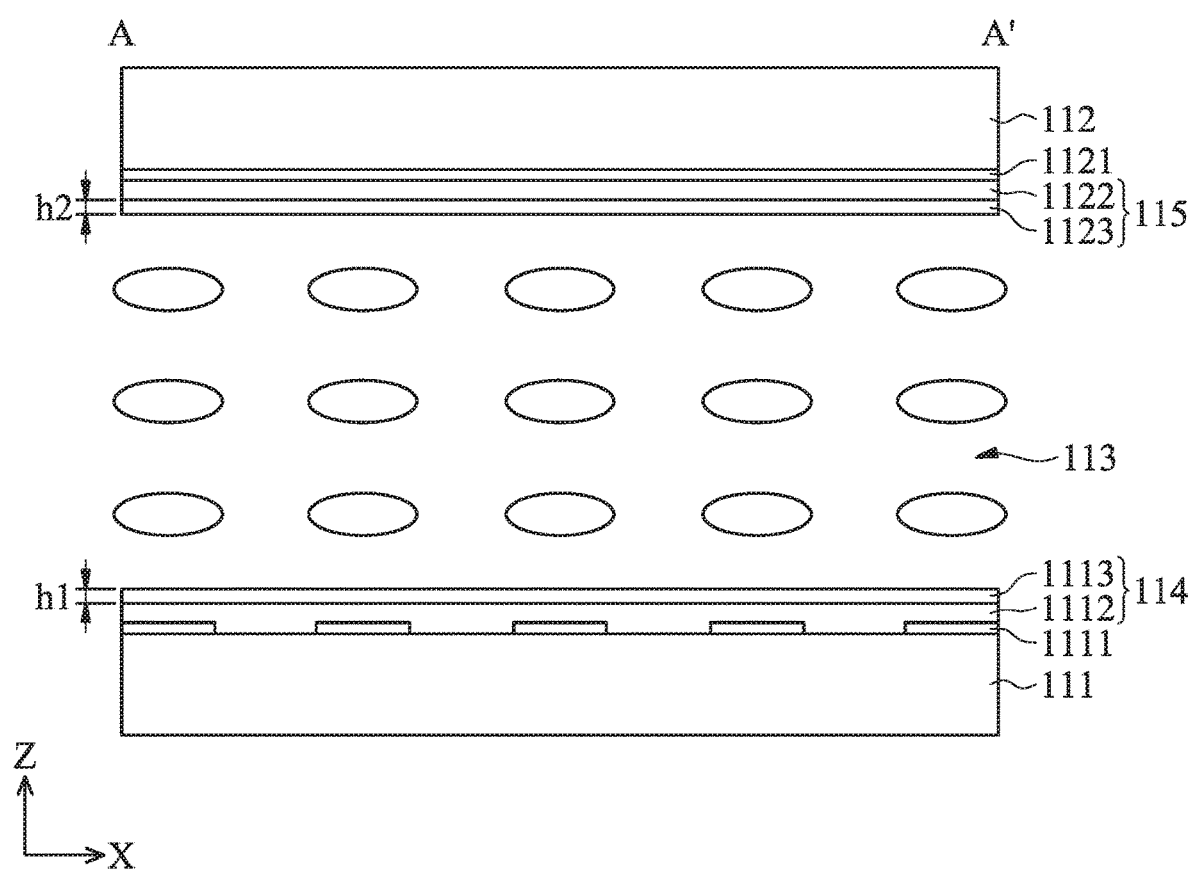
FIG. 3 is a cross-sectional view of a modulation unit of a radiation device according to an embodiment of the present disclosure.

In the embodiment shown in FIG. 3, for example, when the film layer structure 114 includes a first alignment layer 1113 and a first insulating layer 1112, and the film layer structure 115 includes a second alignment layer 1123 and a second insulating layer 1122, the resistivity of the entire film layer structure 114 and/or the entire film layer structure 115 can be adjusted to between $10^8$ to $5 \times 10^{14}$ ohm-cm, or it can be between $10^{12}$ to $10^{14}$ ohm-cm, which can increase the modulation range of the equivalent capacitance of the radiation device 1.

In an embodiment, when the resistivity of the film layer structure 114 or the film layer structure 115 is adjusted within the foregoing range, the thickness of the first alignment layer 1113, the second alignment layer 1123, or both may be adjusted further in order to increase the modulation range of the equivalent capacitance of the modulation unit 11. For example, as shown in FIGS. 2 and 3, the thickness of the first alignment layer 1113 in the film layer structure 114 and/or the second alignment layer 1123 in the film layer structure 115 (such as h1 or h2 in FIG. 2 or 3), can be adjusted to between 0.01 and 0.08 micrometers (μm), or between 0.03 and 0.06 micrometers. Adjusting the thickness of the first alignment layer 1113 and/or the second alignment layer 1123 can increase the modulation range of the equivalent capacitance of the radiation device 1, increase the frequency modulation range of the radiation signal emitted by the radiation device 1, and improve the efficiency of the radiation device 1.

In another embodiment, the dielectric constant of the film layer structure 114, the film layer structure 115, or both may be adjusted to increase the modulation range of the equivalent capacitance of the modulation unit 11. For example, the dielectric constant of the film layer structure 114, the film layer structure 115, or both may be adjusted to be between 3.5 and 5. In the embodiment shown in FIG. 2, for example, when the first alignment layer 1113 is used as the film layer structure 114 and the second alignment layer 1123 is used as the film layer structure 115, the dielectric constant of the first alignment layer 1113 and/or the second alignment layer 1123 can be adjusted to between 3.5 and 5, so as to increase the modulation range of the equivalent capacitance of the radiation device 1. In an embodiment, for example, as shown in FIG. 3, when the film layer structure 114 includes the first alignment layer 1113 and the first insulating layer 1112, and the film layer structure 115 includes the second alignment layer 1123 and the second insulating layer 1122, the dielectric constant of the entire film layer structure 114 and/or the entire film layer structure 115 can be adjusted to between 3.5 and 5, so as to increase the modulation range of the equivalent capacitance of the radiation device 1.

In an embodiment, when the dielectric constant of the film layer structure 114 or the film layer structure 115 is adjusted within the foregoing range, the thickness of the film layer structure 114, the film layer structure 115, or both may be adjusted further to increase the modulation range of the equivalent capacitance of the modulation unit 11. As described above, for example, as shown in FIG. 2 or FIG. 3, the thickness of the first alignment layer 1113 in the film layer structure 114 and/or the second alignment layer 1123 in the film layer structure 115 can be adjusted to between 0.01 and 0.08 micrometers, respectively, or it may be between 0.03 and 0.06 micrometers to improve the efficiency of the radiation device 1.

The thickness of the first alignment layer 1113 is the maximum distance in the normal direction of the surface of the first substrate 111 (such as the Z direction in FIG. 2 or FIG. 3), and the thickness of the second alignment layer 1123 is the maximum distance in the normal direction of the surface of the second substrate 112 (such as the Z direction in FIG. 2 or FIG. 3).

According to the above embodiments, the radiation device 1 of the present disclosure can increase the modulation range of the equivalent capacitance of the modulation unit 11 and increase the frequency modulation range of the radiation signal to improve the efficiency of the radiation device 1.

Hereinafter, different embodiments of the present disclosure will be described. In these embodiments, three alignment layers with different levels of resistivity and different dielectric constants are respectively used as a film layer structure, so as to compare the modulation range of the equivalent capacitance of each modulation unit 11 having a different film layer structure.

Figure 4:
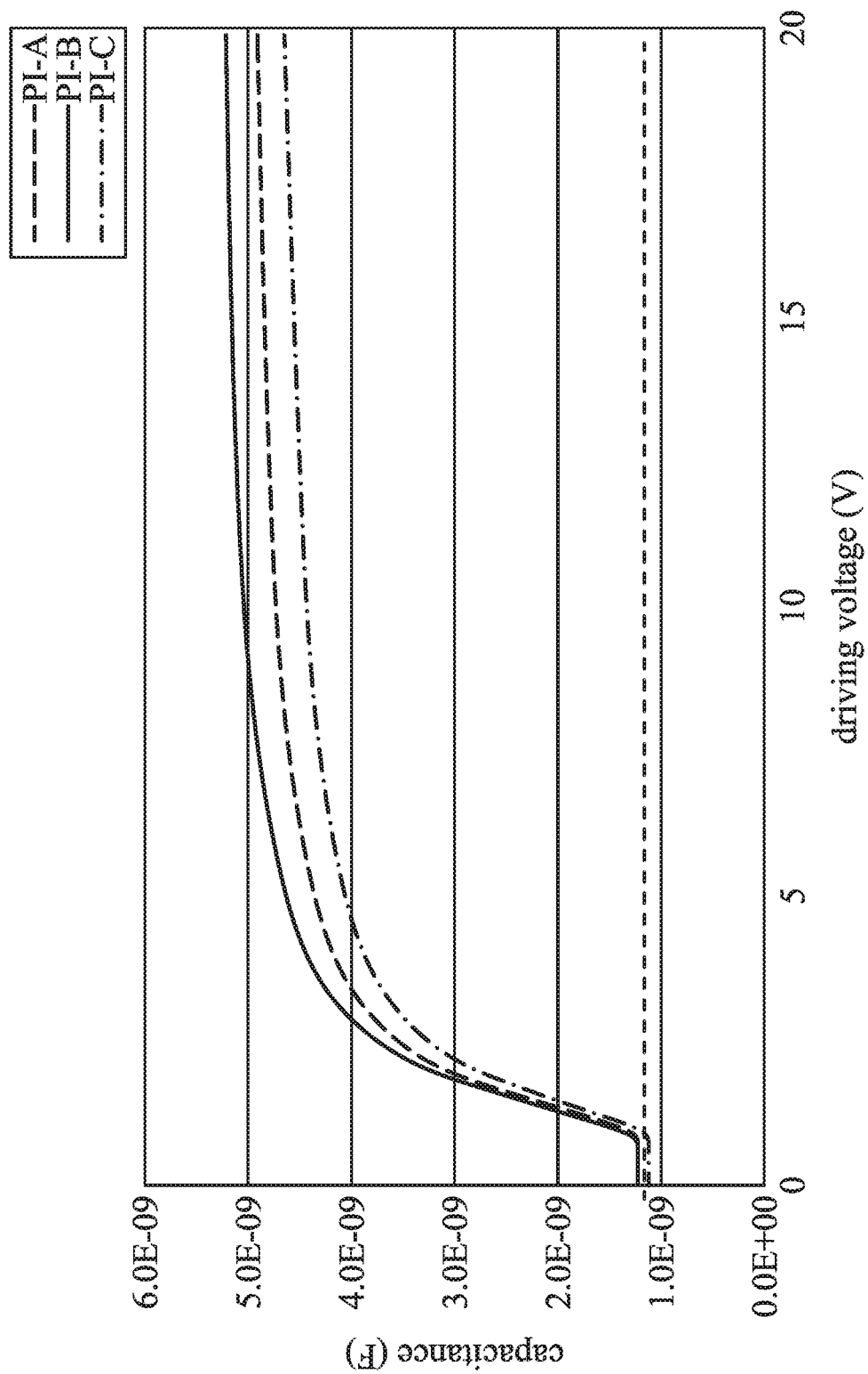
FIG. 4 is a graph showing driving voltage versus capacitance of a radiation device with different alignment layers as the film layer structure.

These three alignment layers are called PI-A, PI-B, and PI-C, respectively. The resistivity and dielectric constant of the alignment layer PI-A, alignment layer PI-B, and alignment layer PI-C are listed in Table 1 below. The alignment layer PI-A, the alignment layer PI-B, and the alignment layer PI-C are respectively used for the film layer structure 114 and the film layer structure 115 in the modulation unit 11 of FIG. 2 of the present disclosure. The modulation unit is driven at a frequency of a drive voltage of 1 kHz. The equivalent capacitance of the modulation unit is measured when the drive voltage is from 0 volts (V) to 20 volts, and the measurement result is shown in FIG. 4. The modulation range of the equivalent capacitance of the modulation unit is also listed in Table 1 below.

TABLE 1

| alignment layer | PI-A | PI-B | PI-C |
|---|---|---|---|
| dielectric constant | 4.5 | 3.9 | 3 |
| resistivity (ohm-cm) | $1.8 \times 10^{15}$ | $7 \times 10^{13}$ | $2 \times 10^{16}$ |
| the modulation range of equivalent capacitance | 105% | 113.13% | 100% |

The resistivity of the alignment layer PI-B is $7 \times 10^{13}$ ohm-cm, and the dielectric constant is 3.9, both of which are within the range mentioned in an embodiment of the present disclosure ($10^8$ to $5 \times 10^{14}$ ohm-cm) and the dielectric constant (3.5 to 5). The resistivity of the alignment layer PI-A is $1.8 \times 10^{15}$ ohm-cm, and the dielectric constant is 4.5. Its resistivity is greater than the range of resistivity ($10^8$ to $5 \times 10^{14}$ ohm-cm) mentioned in an embodiment of the present disclosure, but the dielectric constant is within the range of the dielectric constant (3.5 to 5) mentioned in an embodiment of the present disclosure. The resistivity of the alignment layer PI-C is $2 \times 10^{16}$ ohm-cm, and the dielectric constant is 3. Its resistivity is greater than the range of resistivity ($10^8$ to $5 \times 10^{14}$ ohm-cm) mentioned in an embodiment of the present disclosure, and the dielectric constant is smaller than the range of the dielectric constant (3.5 to 5) mentioned in an embodiment of the present disclosure. Therefore, with the alignment layer PI-C as the reference, the modulation ranges of the equivalent capacitances of the alignment layer PI-A and the alignment layer PI-B are measured respectively.

In FIG. 4, the horizontal axis is the driving voltage (in volts, V), and the vertical axis is the capacitance value (in farads, F). It can be seen from FIG. 4 that when the driving voltage is 0 volts, the capacitance values of the three are approximately the same; when the driving voltage increases, the equivalent capacitance value increases; and when the driving voltage is 20 volts, the modulation unit using the alignment layer PI-B has the largest capacitance value, followed by the capacitance value of the modulation unit using the alignment layer PI-A, and the capacitance value of the modulation unit using the alignment layer PI-C. Compare the difference in capacitance between 0 volts and 20 volts. If the difference in equivalent capacitance of the modulation unit using the alignment layer PI-C is 100%, the modulation range of the equivalent capacitance of the modulation unit using the alignment layer PI-A is 105%, and the modulation range of the equivalent capacitance of the modulation unit using the alignment layer PI-B is 113.13%.

Through these embodiments, when the dielectric constant of the film layer structure is within the range mentioned in the present disclosure, the modulation range of the equivalent capacitance can be increased. When the resistivity of the film layer structure is within the range mentioned in the present disclosure, the modulation range of the equivalent capacitance can also be increased. Therefore, the present disclosure increases the modulation range of the equivalent capacitance, increases the frequency modulation range of the radiation signal, and improves the efficiency of the radiation device.

The above disclosed features can be combined, modified, replaced, or reused with one or more disclosed embodiments in any suitable manner, and are not limited to specific embodiments.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A radiation device, comprising:
a first substrate;
a first electrode disposed on the first substrate;
a second substrate;
a second electrode disposed on second substrate;
a dielectric layer disposed between the first substrate and the second substrate; and
a film layer structure disposed on the first substrate,
wherein a resistivity of the film layer structure is between $10^8$ and $5 \times 10^{14}$ Ω-cm, and a projection area of the second electrode on the first substrate completely overlaps a projection area of the first electrode on the first substrate.

2. The radiation device as claimed in claim 1, wherein the resistivity of the film layer structure is between $10^{12}$ and $10^{14}$ ohm-cm.

3. The radiation device as claimed in claim 1, wherein the film layer structure comprises an alignment layer.

4. The radiation device as claimed in claim 3, wherein a thickness of the alignment layer is between 0.01 and 0.08 micrometers.

5. The radiation device as claimed in claim 3, wherein the film layer structure further comprises an insulating layer which is disposed between the alignment layer and the first substrate.

6. The radiation device as claimed in claim 1, further comprising another film layer structure disposed on the second substrate, wherein a resistivity of the another film layer structure is between $10^8$ and $5 \times 10^{14}$ Ω-cm.

7. The radiation device as claimed in claim 6, wherein the resistivity of the another film layer structure is between $10^{12}$ and $10^{14}$ ohm-cm.

8. The radiation device as claimed in claim 6, wherein the another film layer structure comprises another alignment layer.

9. The radiation device as claimed in claim 8, wherein a thickness of the another alignment layer is between 0.03 and 0.06 micrometers.

10. The radiation device as claimed in claim 8, wherein the second film layer structure further comprises another insulating layer which is disposed between the another alignment layer and the second substrate.

11. A radiation device, comprising:
a first substrate;
a first electrode disposed on the first substrate;
a second substrate;
a second electrode disposed on second substrate;
a dielectric layer disposed between the first substrate and the second substrate; and
a film layer structure disposed on the first substrate,
wherein a dielectric constant of the film layer structure is between 3.5 and 5, and a projection area of the second electrode on the first substrate completely overlaps a projection area of the first electrode on the first substrate.

12. The radiation device as claimed in claim 11, wherein the film layer structure comprises an alignment layer.

13. The radiation device as claimed in claim 12, wherein a thickness of the alignment layer is between 0.01 and 0.08 micrometers.

14. The radiation device as claimed in claim 12, wherein a thickness of the alignment layer is between 0.03 and 0.06 micrometers.

15. The radiation device as claimed in claim 12, wherein the film layer structure further comprises an insulating layer which is disposed between the alignment layer and the first substrate.

16. The radiation device as claimed in claim 11, further comprising a second film layer structure disposed on the second substrate, wherein a dielectric constant of the another film layer structure is between 3.5 and 5.

17. The radiation device as claimed in claim 16, wherein the another film layer structure comprises another alignment layer.

18. The radiation device as claimed in claim 17, wherein a thickness of the another alignment layer is between 0.01 and 0.08 micrometers.

19. The radiation device as claimed in claim 17, wherein a thickness of the another alignment layer is between 0.03 and 0.06 micrometers.

20. The radiation device as claimed in claim 18, wherein the another film layer structure further comprises another insulating layer which is disposed between the another alignment layer and the second substrate.

* * * * *